(12) United States Patent
Naccache

(10) Patent No.: US 7,966,145 B2
(45) Date of Patent: Jun. 21, 2011

(54) INTEGRATED CIRCUIT AND THE CORRESPONDING TEST METHOD, COMPUTER DEVICE AND PROGRAM

(75) Inventor: David Naccache, Paris (FR)

(73) Assignee: Compagnie Industries et Financiere D'Ingenierie "Ingenico", Neuilly sur Seine (FR)

( * ) Notice: Subject to any disclaimer, the term of this patent is extended or adjusted under 35 U.S.C. 154(b) by 202 days.

(21) Appl. No.: 12/030,568

(22) Filed: Feb. 13, 2008

(65) Prior Publication Data

US 2008/0195345 A1    Aug. 14, 2008

(30) Foreign Application Priority Data

Feb. 13, 2007   (FR) ...................................... 07 01094

(51) Int. Cl.
*G01R 31/00* (2006.01)

(52) U.S. Cl. ........................................ 702/118; 702/120

(58) Field of Classification Search .......... 702/117–121; 326/9–16; 714/25, 30, 31; 257/48
See application file for complete search history.

(56) References Cited

U.S. PATENT DOCUMENTS

| 4,194,432 | A | * | 3/1980 | Conway et al. | 89/41.18 |
| 6,043,712 | A | * | 3/2000 | Leizerovich et al. | 330/279 |
| 6,714,038 | B2 | * | 3/2004 | Lee et al. | 326/16 |
| 2003/0001589 | A1 | * | 1/2003 | Chan et al. | 324/550 |
| 2003/0172333 | A1 | | 9/2003 | Wehage | |
| 2005/0186726 | A1 | * | 8/2005 | Whetsel et al. | 438/230 |

OTHER PUBLICATIONS

French Search Report from French application No. FR07/01094 dated Oct. 1, 2007.
Voyiatzis et al., I., "A Concurrent Built-In Selt-Test Architecture Based on a Selt-Testing RAM", IEEE Transactions on Reliability, Vo. 54, No. 1, pp. 69-78, Mar. 2005.

* cited by examiner

*Primary Examiner* — Mohamed Charioui
*Assistant Examiner* — Ricky Ngon
(74) *Attorney, Agent, or Firm* — David D. Brush; Westman, Champlin & Kelly, P.A.

(57) ABSTRACT

An integrated circuit is provided, which includes at least one external input, a power supply and a plurality of elementary components, each having at least one internal input and at least one internal output. The circuit further includes at least one test unit having an AND gate, each input of which is connected to an internal output of one of the elementary components and an output of which is connected to the power supply via a resistor.

15 Claims, 4 Drawing Sheets

INTEGRATED CIRCUIT AND THE CORRESPONDING TEST METHOD, COMPUTER DEVICE AND PROGRAM

CROSS-REFERENCE TO RELATED APPLICATIONS

None.

FIELD OF THE DISCLOSURE

The field of the disclosure is that of integrated circuits and more precisely tests on such circuits.

Integrated circuit means in particular integrated electronic systems such as electronic chips or microprocessors. In particular, the disclosure concerns the tests performed at the end of manufacture of such circuits, before they are sold or brought into service.

BACKGROUND OF THE DISCLOSURE

There already exist test methods for electronic integrated circuits that make it possible to measure their quality and reliability so as to increase their production yield.

For example, a known technique for testing integrated circuits, illustrated in FIG. 1, consists of connecting all the registers (sequences, counters, RAM (Random Access Memory) etc) present in a chip or integrated electronic circuit, by means of a "scanline" (the output of a register being connected to the input of the following register), and then operating the circuit in order to observe the final state after interruption of its functioning at a predefined time.

The state of the circuit is then obtained by "scanning" all the registers (denoted R1 . . . R7), that is to say by emptying them one after the other (via the "scanline"), in order to obtain a series of states. This series of states is then compared with a reference series of states, expected for the circuit being tested.

A major drawback of this technique lies in the fact that connecting all the registers requires the use of a lot of resources and complex implementation, requiring dedicated connection technology.

In addition, the "scanline" linking all the registers separates the circuit into two parts and makes installing elementary components in this circuit more complex, preventing certain connections between components situated on each side of this link (or requires the use of dedicated means ("bridges") to pass over this link, or "boundary", between the two parts).

SUMMARY

An aspect of the disclosure relates to a novel solution that does not have at least some of the drawbacks of the prior art, in the form of an integrated circuit comprising at least one external input, a power supply and a plurality of electronic components, each having at least one internal input and at least one internal output.

According to an example, such a circuit comprises at least one test unit comprising an AND gate, each input of which is connected to an internal output of one of said elementary components and the output of which is connected to said power supply, via a resistor.

Thus an aspect of the disclosure makes it possible to test the elementary components integrated on a circuit and to detect the defective components on this integrated circuit, using one or more test units corresponding to the testing of several elementary components of the circuit, and reading the result of the test at the power supply, for example by following the variations therein.

According to an advantageous embodiment, said internal outputs connected to said inputs of the AND gate are selected so that said AND gate delivers a "1" if said elementary components of the test unit in question are in conformity, in a test configuration in which a predetermined test sequence is injected via said external input or inputs.

This is because a principle of the test method according to an example is based on the injection into the circuit of a test sequence for each test unit, making it possible to detect whether at least one elementary component is defective, according to the value of the output of the AND gate of each test unit.

In other words, for a test unit, a test sequence is injected, via the external input or inputs of the integrated circuit, this test sequence bringing about, after processing, the required states (if the component is in conformity) at the inputs of the elementary components to be tested. The outputs of these internal components are connected to the inputs of an AND gate and must be equal to "1" if everything is correct. A "1" is therefore expected at the output of the AND gate if the components are in conformity, a "0" if at least one of the components is defective.

A test configuration therefore corresponds to the injection of a predetermined test sequence making it possible to have a "1" at the output of the AND gate of the test unit observed if the components tested are in conformity.

It is of course possible to provide for one of the inputs of the AND gate to have an inverter, so that all said inputs are equal to "1" in said test configuration.

According to the test sequence injected, some internal outputs of some of the components can in fact be equal to "0" and are thus inverted to have "1" values at the input of the AND gate.

According to an advantageous aspect of the disclosure, the integrated circuit comprises at least two test units, each associated with a distinct zone of said circuit.

Thus the integrated circuit has several zones, each comprising one or more elementary components. Each zone also comprises a test unit as described above.

Said inputs of each of said test units are preferentially preselected so that a dedicated test configuration is associated with each test unit, to allow an independent test with each of said zones.

Thus a dedicated test unit and also a dedicated test sequence correspond to each zone of the circuit. This makes it possible to test the elementary components of the circuit by groups (by zones), each zone being tested successively, using a dedicated test configuration, to make it possible to locate any defective components.

Each test configuration therefore makes it possible, if all the elementary components of the circuit are in conformity, to make each AND gate of each test unit pass successively to "1". The test configuration of the unit is chosen so that the other test units deliver a "0".

According to a particular aspect of the disclosure, such an integrated circuit advantageously comprises means of inactivating said test unit or units.

Thus the circuit test units can be deactivated, for example to enable the circuit to go into a "normal" operating state. This deactivation of the circuit test mode can be used in particular for reasons of security and reliability. This is because the circuit test mode is a mode giving rise to an over-consumption of current which may prove to be problematic or even dangerous in normal operating mode, in particular in the case of special circuits (for example a circuit installed in a pacemaker).

According to another aspect of the disclosure, at least one of said means of inactivating at least one of said test units comprises an OR gate, a first internal input of which is connected to the output of the AND gate of said test unit, a second internal input of which is connected to an inactivation command signal and the output of which is connected to said resistor.

Thus the injection of the inactivation command signal makes the output of the OR gate go routinely to "1" and therefore neutralize the test unit.

According to another example, said inactivation control signal is delivered by an internal fuse that trips once and for all on reception of a trip signal delivered by the output of an inactivation AND gate, the inputs of which receive a predetermined test inactivation sequence.

Thus, once the testing of all the zones of the circuit has been carried out, it is possible to definitively deactivate the test units by making the fuses trip, so as to put the circuit in normal operating mode. According to another approach a general fuse may be provided, deactivating all the test units.

Preferentially, such a circuit comprises test inactivation verification means comprising an AND gate whose inputs are connected to the terminals of said fuse and whose output is connected to said power supply, via a second resistor.

Thus it is possible to check at any time that the test units have been deactivated and that the circuit can function normally. It is thus ensured that a circuit whose test mode has not been deactivated is not put on the market.

Another aspect of the disclosure concerns a method of testing an integrated circuit implemented as described above.

According to an aspect of the disclosure, such a method of testing an integrated circuit comprises a test phase comprising, for at least one test unit, the following steps:

sending a predetermined test sequence via at least one of said external inputs of said integrated circuit;

observing the current in said resistor;

conformity decision delivering conformity or non-conformity information for said zone, according to said observation.

Thus it is possible to simply and effectively test a circuit as described previously, by measuring the current at the power supply.

The principle of the test method according to an aspect of the disclosure includes in fact, for a test unit corresponding to the zone to be tested of the integrated circuit, of sending a predetermined test sequence via at least one of said external inputs of said integrated circuit, and then observing the current in the resistor of the test unit and finally delivering conformity or non-conformity information for the zone in question, according to said observation.

Thus the observation of the current in the resistor makes it possible to take into account the behaviour of the elementary components of the zone to be tested in response to the injection of a test sequence dedicated to this zone in order to detect whether one or more of the components of the zone to be tested is defective.

The method according to an aspect of the disclosure delivers conformity information corresponding to the testing of a zone of the circuit.

Preferentially, when the circuit comprises several zones, said test phase is implemented successively for each zone of said circuit and the test method delivers overall conformity information for said circuit or non-conformity information identifying at least one faulty zone of said circuit.

Thus the test method according to an aspect of the disclosure implements the various steps of the test phase for each zone to be tested, using each test unit added to the circuit. In this way the test method makes it possible to deliver an overall conformity decision on the circuit, taking into account the various items of successive conformity information obtained for each zone of the circuit.

According to a particular aspect, the test method stops as soon as an error is detected, that is to say as soon as a test phase has delivered non-conformity information.

This is because such an integrated circuit is often judged unusable and in particular not "repairable" if one of these components is defective. For greater testing speed, it is then preferable to stop the test method as soon as an error is detected.

On the other hand, if it is wished to locate the error, for example in order to count and produce statistics on the defective components, it may then be preferable to continue to test the remaining zones of the circuit in order to benefit at the end from the location of the defective zone or zones.

According to a particular aspect of the disclosure, the method comprises a test inactivation step for neutralizing the current consumption in said resistor, after said test phase.

Thus, once the test has been carried out and the circuit validated as not including any defective components, the method can deactivate the test units, neutralizing the flow of current in the resistor, and thus put the circuit in a normal operating state. This inactivation step corresponds for example to a circuit in which a test inactivation command signal is passing.

Preferentially, said inactivation step comprises a step of sending an inactivation sequence.

In this case, which corresponds to a circuit to which there is added a fuse generating a test inactivation control signal, an inactivation sequence is sent, for example via external outputs of the circuit, in order to trip the fuse in question.

According to this particular aspect, such a method comprises a test inactivation verification step comprising the following sub-steps:

repetition of said test inactivation step, observation of the current in said resistor.

Thus the method can also verify that the elements used for the test are deactivated, verifying that a second sending of a test inactivation sequence has no effect when the test mode has indeed been previously deactivated.

The disclosure also concerns a device for testing an integrated circuit carried out as described previously.

In particular, such a device comprises, for a test unit corresponding to one of said zones of said circuit, test means comprising:

means of sending a predetermined test sequence via at least one of said external inputs of said integrated circuit;

means of observing the current in said resistor;

conformity decision means delivering conformity or non-conformity information for said zone, according to said observation.

In particular, such a device is able to implement the test method described previously.

Finally, the disclosure also concerns computer programs that can be downloaded from at least one communication network and/or recorded on a medium that can be read by a computer and/or executed by a processor, comprising program code instructions for implementing the test method described previously.

BRIEF DESCRIPTION OF THE DRAWINGS

Other characteristics and advantages will emerge more clearly from a reading of the following description of a particular embodiment given by way of simple illustrative and non-limitative example, and accompanying drawings, among which.

DETAILED DESCRIPTION OF ILLUSTRATIVE EMBODIMENTS

1. General Aspects

Figure 1:
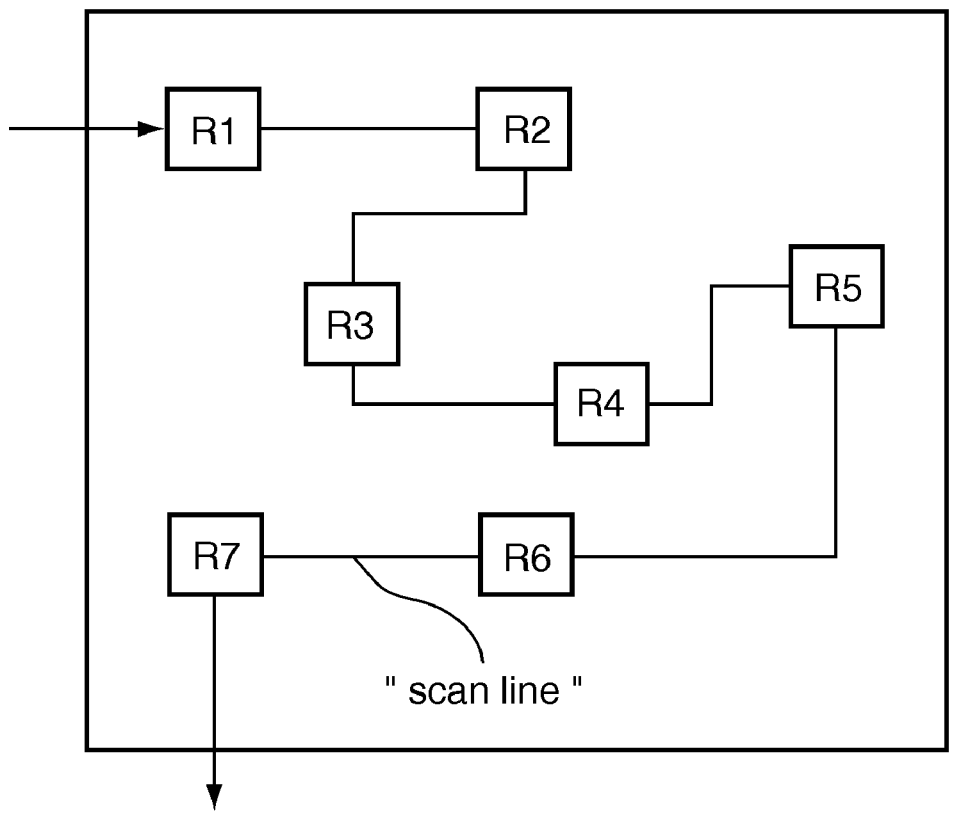
FIG. 1, already commented on in relation to the prior art, illustrates an example of an integrated circuit test technique according to the prior art, having a "scanline"
Figure 2:
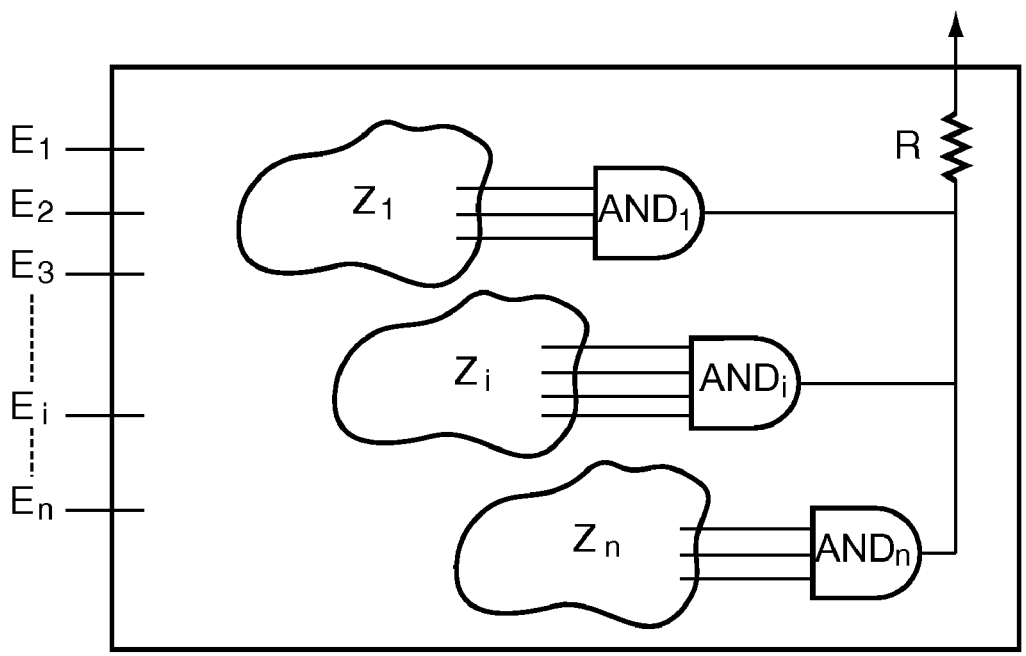
FIG. 2 presents an example of an integrated circuit according to a particular aspect of the disclosure.

The general principle of an aspect of the disclosure is based on the analysis of the electrical behaviour of one or more defined zones or parts of an integrated circuit, in response to activation by means of one or more external inputs of this circuit, denoted $E_1, E_2 \ldots, E_i, \ldots, E_n$ in FIG. 2.

An aspect of the disclosure proposes in particular a test method and a corresponding test device, as well as specific integrated circuits, for using this method and device.

The test method determines the various zones to be tested of the circuit, so as to be able to locate any error detected.

As described in relation to FIG. 2, the integrated circuit to be tested has several zones to be tested $Z_1, Z_2 \ldots Z_i, \ldots Z_n$.

A description is first of all given of the use of the method and the corresponding circuit for a zone $Z_i$ of the circuit, and then the integration of the method in each zone of the circuit for an overall result on the reliability, or the conformity, of the complete circuit.

2. Testing of the Elementary Components on a Zone of the Circuit

The test principle is based in particular on the a priori knowledge of the logic behaviour expected of each component of the zone of the circuit tested, in response to a particular actuation.

Figure 3:
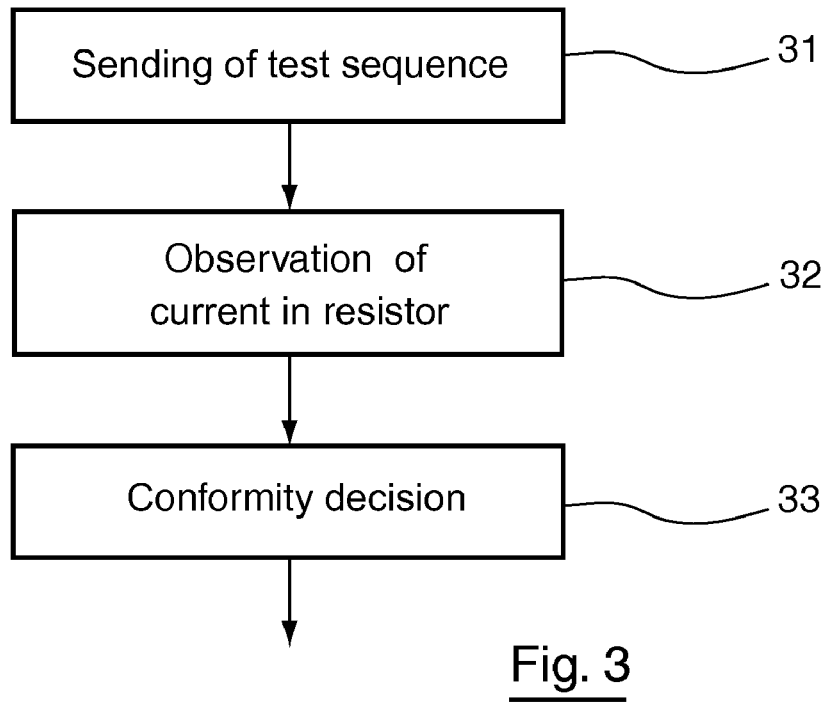
FIG. 3 presents the various steps of the method for a zone of an integrated circuit as illustrated in FIG. 2, according to a particular aspect of the disclosure.

As illustrated in FIG. 3, the first step 31 therefore consists of injecting a test sequence, by means of the external inputs of the circuit, at the inputs of the components belonging to a zone to be tested.

This test sequence gives rise to a particular behaviour of the circuit and a particular final state of each of the components of the zone to be tested, which then have at their output a particular and expected logic state.

Figure 4:
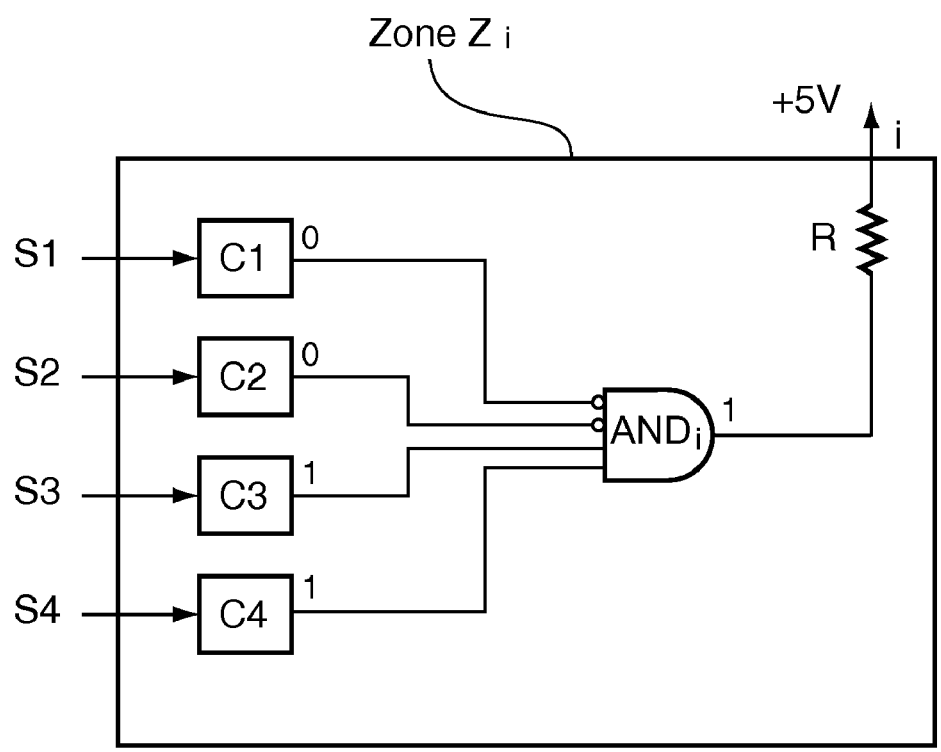
FIG. 4 presents an example of a zone of an integrated circuit for testing elementary components of this zone according to a particular aspect of the disclosure.

These various outputs are connected to the inputs of a logic AND gate, hereinafter referred to as "$AND_i$", added to the integrated circuit for implementing the test method (as described below in relation to FIG. 4).

The output of this gate "$AND_i$" is connected to a resistor R, itself connected to the power supply of the circuit as presented below in relation to FIG. 4.

The second step 32 of the method according to this particular embodiment of the disclosure consists of observing the current in this resistor, in order then to deliver a conformity decision during a step 33.

These various steps are detailed below in relation to FIG. 4, which presents a zone "$Z_i$" to be tested, according to a particular embodiment, It should be stated that, in such a circuit, a logic "1" state corresponds to a voltage equal to +5V (or more generally to the supply voltage), and a logic "0" state corresponds to a voltage equal to 0V.

There are therefore considered for example, in a zone $Z_i$, a first component C1 taking the logic "0" state in response to a first actuation S1, a second component C2 taking the logic "0" state in response to a second actuation S2, a third component C3 taking the logic "1" state in response to a third actuation S3 and a fourth component C4 taking the logic "1" state in response to a fourth actuation S4.

The expected logic states of the respective outputs of the four components, in response to a test sequence comprising the four previously defined actuations "S1 S2 S3 S4") form the series of states "0 0 1 1".

These states are taken into account to determine the four inputs of a logic "AND" gate denoted "$AND_i$", so that the output of this gate "$AND_i$" is equal to "1" if the states of the four components are the expected states, in response to the predetermined test sequence, and to "0" if at least one of the states of the four components is not the expected state.

Where applicable, an inverter makes it possible to convert a "0" output of a component into an input of the "AND" gate equal to "1".

The output of this gate "$AND_i$" is then connected to a resistor R, itself connected to the power supply of the circuit.

The variations in current i in the resistor R are now observed. Two cases are presented:

if the output of the gate "$AND_i$" is equal to "1" (the case where the states of all the components correspond to those expected), the resistor R is connected between two identical potential values (here +5V), and no flow of current in R is observed;

if the output of the gate "$AND_i$" is equal to "0" (the case where at least one of the states of the components does not correspond to the one expected), the resistor R is connected between 0V and +5V, which causes a non-zero flow of current in R.

Thus, by observing the flow of current i in the resistor R, it is possible to detect an error in the relevant circuit zone "$Z_i$" since, if the consumption of current in R increases in response to the test sequence, it is deduced from this that one of the components tested is not behaving as expected.

On the other hand, if the current consumption in R does not vary significantly, it is deduced from this that all the components tested in the zone "$Z_i$" are behaving as expected.

The variations in current in R are evaluated according to a threshold, beyond which the test method decides that an error is detected in the circuit zone tested.

This threshold can be determined for example according to the expected performance of the component test method.

3. Testing of the Elementary Components of the Complete Circuit

Figure 5:
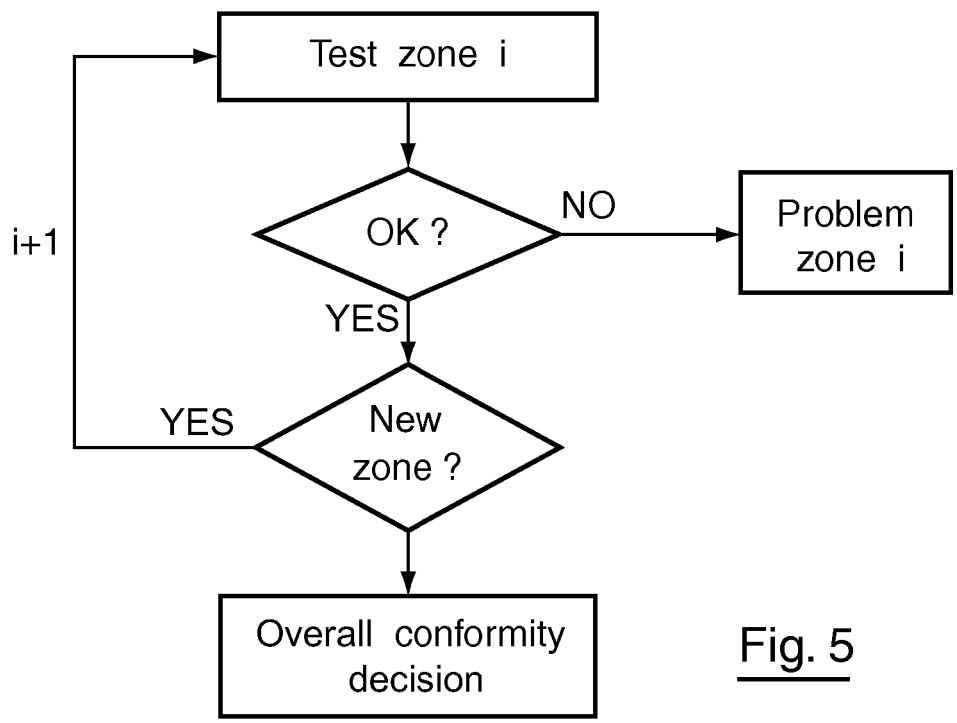
FIG. 5 is a simplified flow diagram illustrating the general principle of the invention for an integrated circuit, according to a particular aspect of the disclosure.

The steps described above are repeated as many times as the circuit comprises different zones, so as to be able to perform an overall test on the circuit, according to the simplified flow diagram in FIG. 5.

The test sequences and the logic gates "$AND_i$" of each of the zones are chosen so as to permit the location of any error detected, so that the outputs of the various gates "$AND_i$" are not equal to "1" at the same time, but successively.

In other words, the "division", or organization, of the circuit in several zones to be tested can be defined so as to be able to determine the corresponding test sequences which, when they are sent successively in the circuit, make it possible to make each of the test gates "$AND_i$" to pass to 1 successively and thus to detect any error in one or more zones of the circuit.

As illustrated in FIG. 5, a first zone (i=1) of the integrated circuit is tested according to the first two steps 31 and 32 of the method, as described previously in relation to FIG. 3.

The method delivers a conformity decision for the zone 1 tested, indicating:
- either a problem for the zone 1;
- or conformity information for the zone 1.

In the first case, the test method can:
- either stop the testing of the rest of the circuit as soon as a problem is detected (this is because, in general, such circuits are not "repairable" and are therefore considered to be unusable if one of the components is defective);
- or continue the testing of the rest of the circuit, storing the zones in which a problem has been detected for an overall counting of the various errors at the end of testing (this solution may be useful for the purpose of producing statistics on the reliability of the components for example, if components are identified as being often defective).

Once the first zone is tested, the method detects whether the circuit has a second zone to be tested (i=2).

If this is not the case, an overall decision on conformity of the circuit is delivered, otherwise the following zone of the circuit is tested, in accordance with the steps previously described, and so on for all the zones of the integrated circuit.

Thus, when all the zones of the circuit have been tested, the test method can deliver an overall decision on conformity of the circuit, for example in the following forms:
- if all the parts tested are in conformity, the overall decision corresponds to conformity information on the circuit;
- if at least one of the parts tested is not in conformity, the overall decision corresponds:
  - either to non-conformity information on the circuit, comprising the identification of the first non-conforming zone;
  - or to non-conformity information on the circuit, comprising the identification of all the non-conforming zones;
  - or simply non-conformity information on the circuit.

4. Activation/Deactivation of Test 4.1 Neutralization of the Test Circuit

According to various particular embodiments of the disclosure, the elements used for implementing the test method above can be activated or not, depending on whether the circuit is functioning in test mode or in "normal" operating mode, that is to say in the use for which it was manufactured.

For this purpose, two particular embodiments are presented below, respectively in relation to FIGS. 6 and 7.

In these two embodiments, the principle of inactivation of the test circuit consists of neutralizing the current consumption in the resistor R at the output of the test gates "$AND_i$".

This is because, the technique of testing components according to the disclosure being based on the observation of the current consumption in this resistor R, neutralizing this current consumption makes it possible to neutralize the test circuit when so desired, that is to say when the circuit is in normal operating mode.

Figure 6:
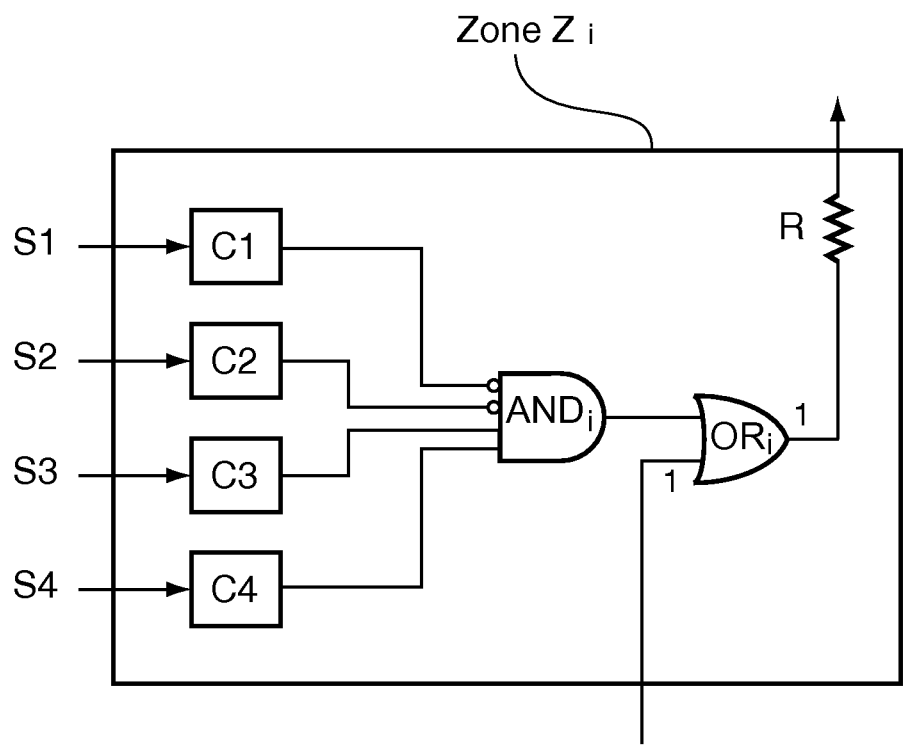
FIG. 6 illustrates an example of a zone of an integrated circuit for the testing and the inactivation of the testing of the elementary components of this zone according to a first embodiment.
Figure 7:
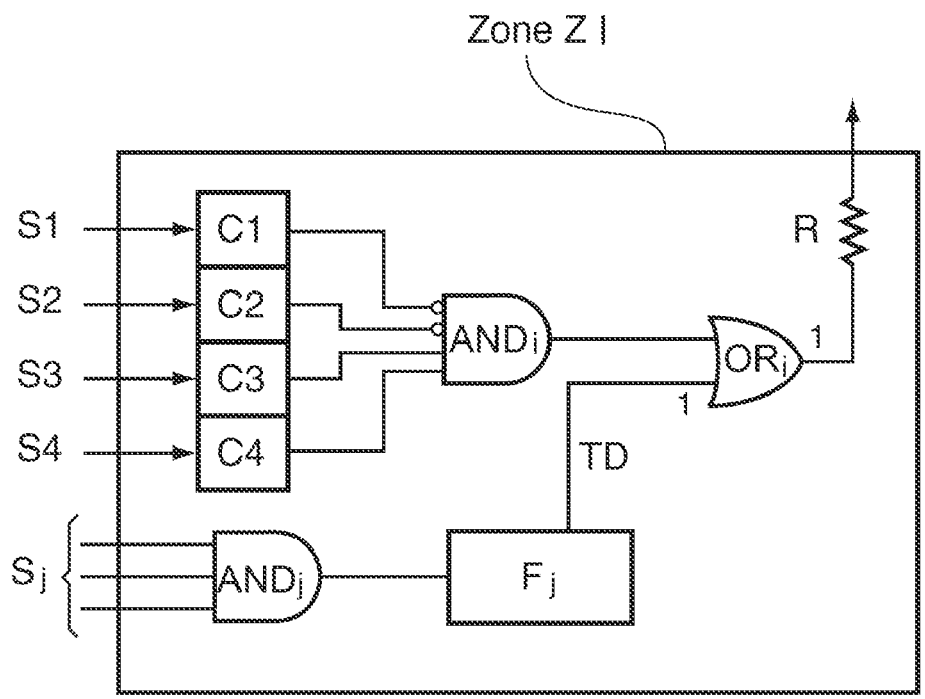
FIG. 7 illustrates an example of a zone of an integrated circuit for the testing and inactivation of the testing of the elementary components of this zone according to a second embodiment.

To do this, it is proposed, as illustrated in FIGS. 6 and 7, to add, at the output of each test gate "$AND_i$", a gate "$OR_i$", which, by virtue of an inactivation command signal, called for example TD ("Test Disable"), always has an output equal to "1", thus neutralizing the flow of current in the resistor R.

4.2 First Embodiment

According to a first embodiment, in relation to FIG. 6, the signal TD can be injected by means of an external input of the circuit and flows in the circuit in a non-linear manner, thus making it possible not to partition it.

The injection of this signal neutralizes all the test circuit.

4.3 Second Embodiment

According to a second embodiment illustrated in FIG. 7, the gate "$OR_i$" has a fuse "$F_j$" as its second input.

When this fuse "$F_j$" trips or "blows" it has an output equal to "1", enabling the gate "$OR_i$" also to have an output equal to "1" and thus to neutralize the flow of current in the resistor R.

The fuse "$F_j$" may for example be a non-volatile memory cell, tripping when an input equal to 1 is presented to it.

In this embodiment, this input of the fuse "$F_j$" is the output of another gate "$AND_j$", called the "test extinction AND gate", having an output equal to "1" in response to a particular activation "$S_j$", called the test extinction activation, determined so as to allow the neutralization of the test circuit (that is to say all the test units), when it is wished to change the circuit from test mode to normal operating mode.

Thus, to change the circuit from test mode to normal operating mode, the signals of the test extinction actuation "$S_j$" are injected, which causes the fuses "$F_j$" to trip and thus neutralizes the test circuit.

According to a variant of this embodiment, it is possible to envisage that one and the same test extinction sequence neutralises the entire test circuit, that is to say makes all the fuses "$F_j$" trip at the same time.

According to another variant, a single fuse can be used to neutralize the whole of the test circuit.

5. Verification of the Neutralization of the Test Circuit

Figure 8:
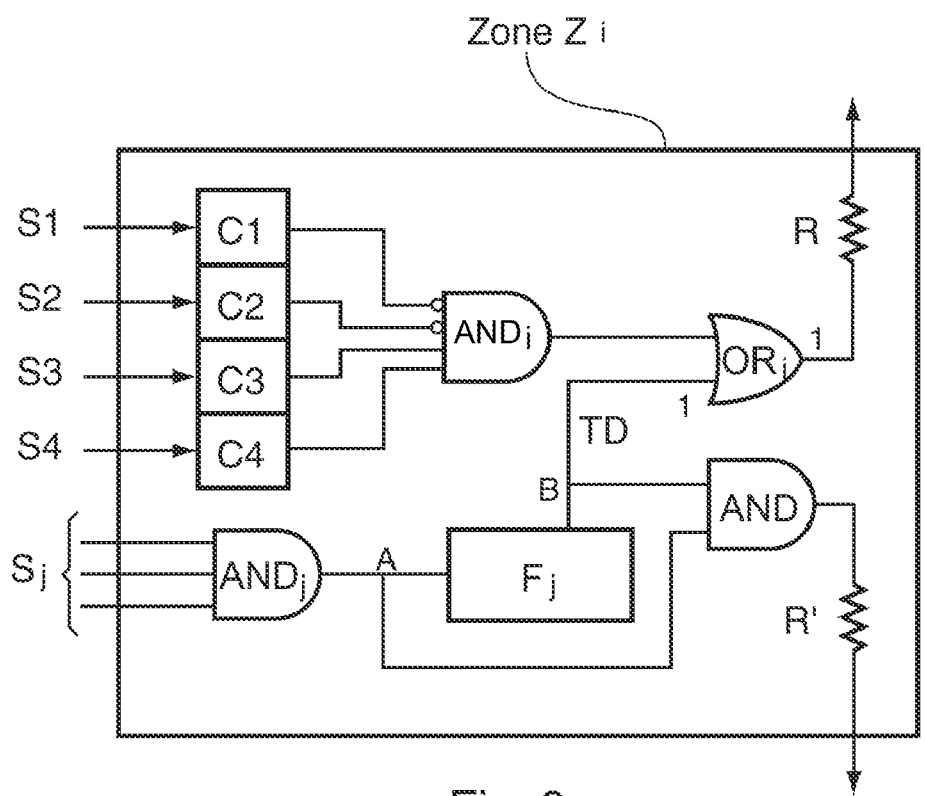
FIG. 8 illustrates an example of a zone of an integrated circuit for the testing, the inactivation of the testing of the elementary components of this zone and the verification of the inactivation of the testing according to the second.

It is also possible, according to the test method, as illustrated in FIG. 8, to ensure that the test circuit is indeed neutralized, in particular in the second embodiment of the neutralization of the test described above.

The principle is to test whether the fuse "$F_j$" has actually tripped, by observing the signals at points A and B, that is to say at the input and output of the fuse "$F_j$" in question.

To do this, an AND gate is added taking as inputs these two signals at points A and B, and a second resistor R' in which the flow of current is observed.

When it is wished to switch to normal operating mode, the test extinction actuation "$S_j$" is injected into the circuit, which results in a signal at point B equal to "1".

When the fuse "$F_j$" has not tripped, the signal at A is therefore equal to "0".

In this case, the second resistor R' is connected between 0V and +5V, which causes a non-zero flow of current.

When the fuse "$F_j$" trips, a variation in the flow of current in the resistor R' is observed.

If the test extinction actuation "$S_j$" is injected again, once the fuse "$F_j$" has tripped, the signals at points A and B are identical and equal to "1", causing the resistor R' to be connected again between two identical potential values (here +5V).

Therefore no flow of current in R' is observed, which confirms that the fuse "$F_j$" has indeed tripped and that the test circuit is indeed deactivated.

An aspect of the disclosure, according to at least one example, provide a simple and effective technique for testing integrated circuits that does not in particular require the presence of a "scanline".

In particular, an example provides such a technique having better performance in terms of connection technology to be used for testing the elementary components of an integrated circuit.

Another aspect of the disclosure provides such a technique that is effective in terms of detection and location of any faults on an electronic circuit and in terms of time necessary for such detections and locations.

Another aspect of the disclosure provides such a technique that can be used at reduced cost and allows rapid checking in a few seconds.

Yet another aspect of the disclosure provides such a technique enabling it to be verified that the testing of the component has indeed been carried out.

Although the present disclosure has been described with reference to one or more examples, workers skilled in the art will recognize that changes may be made in form and detail without departing from the scope of the disclosure and/or the appended claims.

What is claimed is:

1. Integrated circuit comprising:
   at least one external input configured to receive a predetermined test sequence having a predetermined test signal pattern in a test mode of the integrated circuit,
   a power supply,
   a plurality of elementary components, each having at least one internal output that is responsive to the predetermined test sequence, and
   at least one test unit comprising an AND gate, each input of the AND gate is connected to an internal output of one of said elementary components and an output of the AND gate is connected to said power supply, via a resistor,
   wherein said internal outputs connected to said inputs of the AND gate are selected so that said AND gate delivers a first logic state if the internal outputs of said elementary components match respective, expected logic states in response to said predetermined test signal pattern being applied to the at least one external input and said AND gate delivers a second, different logic state if at least one of the internal outputs of said elementary components does not match the respective, expected logic state.

2. Integrated circuit according to claim 1, wherein at least one of said inputs of the AND gate has an inverter, so that all said inputs are equal to the first logic state in said test configuration in response to said predetermined test signal pattern being applied to the at least one external input.

3. Integrated circuit according to claim 1, wherein the integrated circuit comprises at least two test units, each associated with a distinct zone of said circuit.

4. Integrated circuit according to claim 3, wherein said inputs of each of said test units are preselected so that a dedicated predetermined test pattern is associated with each test unit, to allow independent testing of each of said zones.

5. Integrated circuit according to claim 1, wherein the integrated circuit comprises means for inactivating said at least one test unit of said integrated circuit.

6. Integrated circuit according to claim 5, wherein at least one of said means for inactivating at least one of said test units comprises an OR gate, wherein a first internal input of the OR gate is connected to the output of the AND gate of said test unit, a second internal input of the OR gate is connected to an inactivation command signal and the output of the OR gate is connected to said resistor.

7. Integrated circuit according to claim 6, wherein said inactivation command signal is delivered by an internal fuse, which trips once and for all on reception of a trip signal delivered by the output of an inactivation AND gate, the inputs of which receive a predetermined test inactivation sequence.

8. Integrated circuit according to claim 7, wherein the integrated circuit comprises test inactivation verification circuit comprising an AND gate having inputs connected to terminals of said internal fuse and an output connected to said power supply via a second resistor.

9. Method of testing an integrated circuit, which comprises:
   at least one external input,
   a power supply,
   a plurality of elementary components, each having at least one internal output that is responsive to the predetermined test sequence, and
   at least one test unit comprising an AND gate, each input of the AND gate is connected to an internal output of one of said elementary components and an output of the AND gate is connected to said power supply, via a resistor; and
   wherein the method comprises a test phase comprising, for at least one test unit, the following steps:
      sending said predetermined test sequence having a predetermined test signal pattern via the at least one external input of said integrated circuit, wherein said internal outputs connected to said inputs of the AND gate are selected so that said AND gate delivers a first logic state if the internal outputs of said elementary components match respective, expected logic states in response to said predetermined test signal pattern being applied to the at least one external input and said AND gate delivers a second, different logic state if at least one of the internal outputs of said elementary components does not match the respective, expected logic state;
      observing current in said resistor; and
      making a conformity decision and delivering conformity or non-conformity information for said zone, according to said observation.

10. Method of testing a circuit according to claim 9, wherein said test phase is implemented successively for each zone of said circuit and delivers overall conformity information for said circuit or non-conformity information designating at least one faulty zone in said circuit.

11. Method of testing a circuit claim 9, wherein the method comprises a test inactivation step comprising neutralizing current consumption in said resistor, after said test phase.

12. Method of testing a circuit according to claim 11, wherein said inactivation step comprises sending an inactivation sequence, which neutralizes the current consumption in said resistor.

13. Method of testing a circuit according to claim 12, wherein the method comprises a test inactivation verification step comprising the following sub-steps:
   repetition of said test inactivation step, and
   observation of current in a second resistor.

14. Device for testing an integrated circuit that comprises:
   at least one external input,
   a power supply,
   a plurality of elementary components, each having at least one internal output that is responsive to the predetermined test sequence, and at least one test unit comprising an AND gate, each input of the AND gate is connected to an internal output of one of said elementary components and an output of the AND gate is connected to said power supply, via a resistor; and wherein the device for testing comprises, for a test unit corresponding to one of said zones of said circuit, test means comprising:

means for sending said predetermined test sequence having a predetermined test signal pattern via said at least one external input of said integrated circuit, wherein said internal outputs connected to said inputs of the AND gate are selected so that said AND gate delivers a first logic state if the internal outputs of said elementary components match respective, expected logic states in response to said predetermined test signal pattern being applied to the at least one external input and said AND gate delivers a second, different logic state if at least one of the internal outputs of said elementary components does not match the respective, expected logic state;

means for observing the current in said resistor; and conformity decision means for delivering conformity or non-conformity information for said zone, according to said observation.

15. A non-transitory computer-readable medium comprising computer program code instructions stored thereon for causing a computer to execute a method of testing an integrated circuit that comprises:

at least one external input, a power supply, a plurality of elementary components, each having at least one internal output that is responsive to the predetermined test sequence, and at least one test unit comprising an AND gate, each input of the AND gate is connected to an internal output of one of said elementary components and an output of the AND gate is connected to said power supply, via a resistor; and wherein the method comprises a test phase comprising, for at least one test unit, the following steps:

sending said predetermined test sequence having a predetermined test signal pattern via said at least one external input of said integrated circuit, wherein said internal outputs connected to said inputs of the AND gate are selected so that said AND gate delivers a first logic state if the internal outputs of said elementary components match respective, expected logic states in response to said predetermined test signal pattern being applied to the at least one external input and said AND gate delivers a second, different logic state if at least one of the internal outputs of said elementary components does not match the respective, expected logic state;

observing current in said resistor; and making a conformity decision and delivering conformity or non-conformity information for said zone, according to said observation.

\* \* \* \* \*

UNITED STATES PATENT AND TRADEMARK OFFICE
CERTIFICATE OF CORRECTION

PATENT NO. : 7,966,145 B2
APPLICATION NO. : 12/030568
DATED : June 21, 2011
INVENTOR(S) : David Naccache Page 1 of 1

It is certified that error appears in the above-identified patent and that said Letters Patent is hereby corrected as shown below:

On the Title Page, Item (73)

Assignee:

Delete "Industries" and insert -- Industrielle --

In the Claims

In column 9, Claim 2:

In line 51, delete "in said test configuration"

In Column 10, Claim 11:

In line 50, delete "circuit claim 9" and insert -- circuit according to claim 9 --

In column 12, Claim 15:

In line 4, delete "the" and insert -- a --

Signed and Sealed this
Thirteenth Day of January, 2015

Michelle K. Lee
*Deputy Director of the United States Patent and Trademark Office*